(12) United States Patent
Korovin

(10) Patent No.: US 6,503,767 B2
(45) Date of Patent: Jan. 7, 2003

(54) PROCESS FOR MONITORING A PROCESS, PLANARIZING A SURFACE, AND FOR QUANTIFYING THE RESULTS OF A PLANARIZATION PROCESS

(75) Inventor: Nikolay Korovin, Phoenix, AZ (US)

(73) Assignee: SpeedFam-IPEC Corporation, Chandler, AZ (US)

( * ) Notice: Subject to any disclaimer, the term of this patent is extended or adjusted under 35 U.S.C. 154(b) by 42 days.

(21) Appl. No.: 09/741,461

(22) Filed: Dec. 19, 2000

(65) Prior Publication Data

US 2002/0086531 A1 Jul. 4, 2002

(51) Int. Cl.$^7$ .............................................. H01L 21/66
(52) U.S. Cl. ....................................................... 438/16
(58) Field of Search ................................ 438/14, 5, 12, 438/16, 17; 427/250; 204/192.15; 324/671

(56) References Cited

U.S. PATENT DOCUMENTS 5,337,015 A * 8/1994 Lustig ........................ 324/671
6,033,921 A * 3/2000 Dawson ....................... 438/5

* cited by examiner

Primary Examiner—John F. Niebling
Assistant Examiner—Andre Stevenson
(74) Attorney, Agent, or Firm—James L. Farmer

(57) ABSTRACT

A process for quantifying the results of a planarization process provides metrics that can be applied to process parameters that affect the planarization results at various localized regions on a surface being planarized. A surface of a work piece is planarized and the results are recorded as an experimental work piece scan by a plurality of measurements of the amount of material removed as a function of the location on the surface of the work piece. The data from the plurality of measurements are fitted to an mth order polynomial to construct an approximation of a low spatial frequency scan. The work piece surface is then divided into a plurality of regions, each of the regions influenced by a process variable in the planarization process. The approximation of the low spatial frequency scan is then analyzed in each of the regions by fitting the low spatial frequency scan in that region to an nth order polynomial. The coefficient of the nth order term is used as a metric for the results in that region. Subsequent work pieces can be processed and measured in like manner; and if a process parameter is changed, changes in the resulting metrics can be used to quantify the results of using the changed process parameter. In a further embodiment, an approximation of a high spatial frequency scan can be achieved by subtracting the approximation of the low spatial frequency scan from the experimental work piece scan. A metric, such as standard deviation, can be used to quantify results of changes in parameters affecting the high spatial frequency components of the process.

29 Claims, 5 Drawing Sheets

PROCESS FOR MONITORING A PROCESS, PLANARIZING A SURFACE, AND FOR QUANTIFYING THE RESULTS OF A PLANARIZATION PROCESS

FIELD OF THE INVENTION

This invention relates generally to a process for monitoring the results of a process, and more specifically to a process for planarizing the surface of a work piece and to quantifying the results of a planarization process.

BACKGROUND OF THE INVENTION

The manufacture of many types of work pieces requires the substantial planarization of at least one surface of the work piece. Examples of such work pieces that require a planar surface include semiconductor wafers, optical blanks, memory disks, and the like. One commonly used technique for planarizing the surface of a work piece is the chemical mechanical planarization (CMP) process. In the CMP process a work piece, held by a work piece carrier head, is pressed against a moving polishing pad in the presence of a polishing slurry. The mechanical abrasion of the surface combined with the chemical interaction of the slurry with the material on the work piece surface ideally produces a planar surface.

The construction of the carrier head, the relative motion between the polishing pad and the carrier head, the composition of the slurry, the composition and texture of the polishing pad, the pressure between the polishing pad and the carrier head, and other process variables have been extensively engineered in an attempt to achieve a uniform removal of material across the surface of the work piece and hence to achieve the desired planar surface. Unfortunately, there has not been an effective technique for the evaluation of the effect of process changes on the uniformity and planarity of the work piece surface. Existing evaluation techniques are inadequate for in depth process evaluation and optimization as they fail to separately quantify the influence of various process parameters. For example, in the semiconductor industry CMP is widely used to planarize the surface of a semiconductor wafer, and a diameter wafer scan of the wafer surface is the most widely used source of information about uniformity and planarity of the wafer surface after the CMP process. Multiple process variables influence the uniformity and planarity, and the diameter wafer scan is not able to adequately distinguish between the affects of those variables. In a diameter wafer scan the amount of material removed from the wafer surface is measured at a plurality of locations along a diameter of the wafer. The measured material removal data is plotted as a function of location along the diameter and the resulting graphical representation can be viewed to obtain a qualitative appraisal of the result of the CMP process. The industrial standard of evaluation—within Wafer Nonuniformity (WIWNU)—evaluates the quality of the wafer surface only from a statistical point of view by calculating the standard deviation of the data. Viewing the results in this manner may provide enough information to form a rough qualitative opinion of process quality, but it provides insufficient information for evaluating process changes and for optimizing and improving the CMP process.

Presently available techniques provide insufficient information for the evaluation and optimization of a planarization process and specifically a CMP process. Accordingly, a need exists for a process for quantifying the results of a CMP process, a planarization process, and indeed, more generally, any process. A need also exists for an improved process for planarizing a surface of a work piece.

BRIEF DESCRIPTION OF THE DRAWINGS

The present invention will be fully understood upon consideration of the following detailed description of the invention taken together with the drawing figures in which like elements have been identified by the same number and in which.

DETAILED DESCRIPTION OF THE INVENTION

This invention relates generally to a process for quantifying the results of a process, especially a planarization process such as a chemical mechanical planarization (CMP) process, and to a process for planarizing a surface of a work piece. For purposes of illustration only, the invention will be described as it applies to a CMP process and specifically as it applies to the CMP processing of a semiconductor wafer. It is not intended, however, that the invention be limited to these illustrative embodiments; instead, the invention is applicable to many processes and to the processing of many types of work pieces.

In accordance with one embodiment of the invention, a semiconductor wafer having a diameter of about 200 mm is subjected to a CMP process. In the CMP process the wafer is held against a carrier head and the surface to be planarized is pressed against a polishing pad in the presence of a polishing slurry. The polishing slurry contains an abrasive material and at least one reagent that is capable of reacting chemically with the surface of the wafer. The polishing pad may be in rotational, orbital, linear, or other motion relative to the carrier head and the wafer, depending on the particular type of CMP equipment being employed. In addition, the carrier head may be in rotational and/or orbital or oscillatory motion relative to its own axis. The relative motion between the carrier head and the wafer attached to the carrier head and the polishing pad is designed to achieve a uniform material removal rate across the surface of the wafer.

After the completion of the CMP operation, the wafer is cleaned and then measured to determine the amount of material removed at a plurality of prescribed locations on the surface of the wafer. Preferably a series of about fifty measurements are made at equally spaced intervals along a diameter of the wafer. The amount of material removed at each location can be determined, for example, by measuring the wafer both before and after the CMP operation. The measurements can be made by mechanical, optical, electrical, or other means, depending on the material on the surface of the wafer. Although the measurements are preferably made along a wafer diameter, the wafer scan can be accomplished along any prescribed path.

Figure 1:
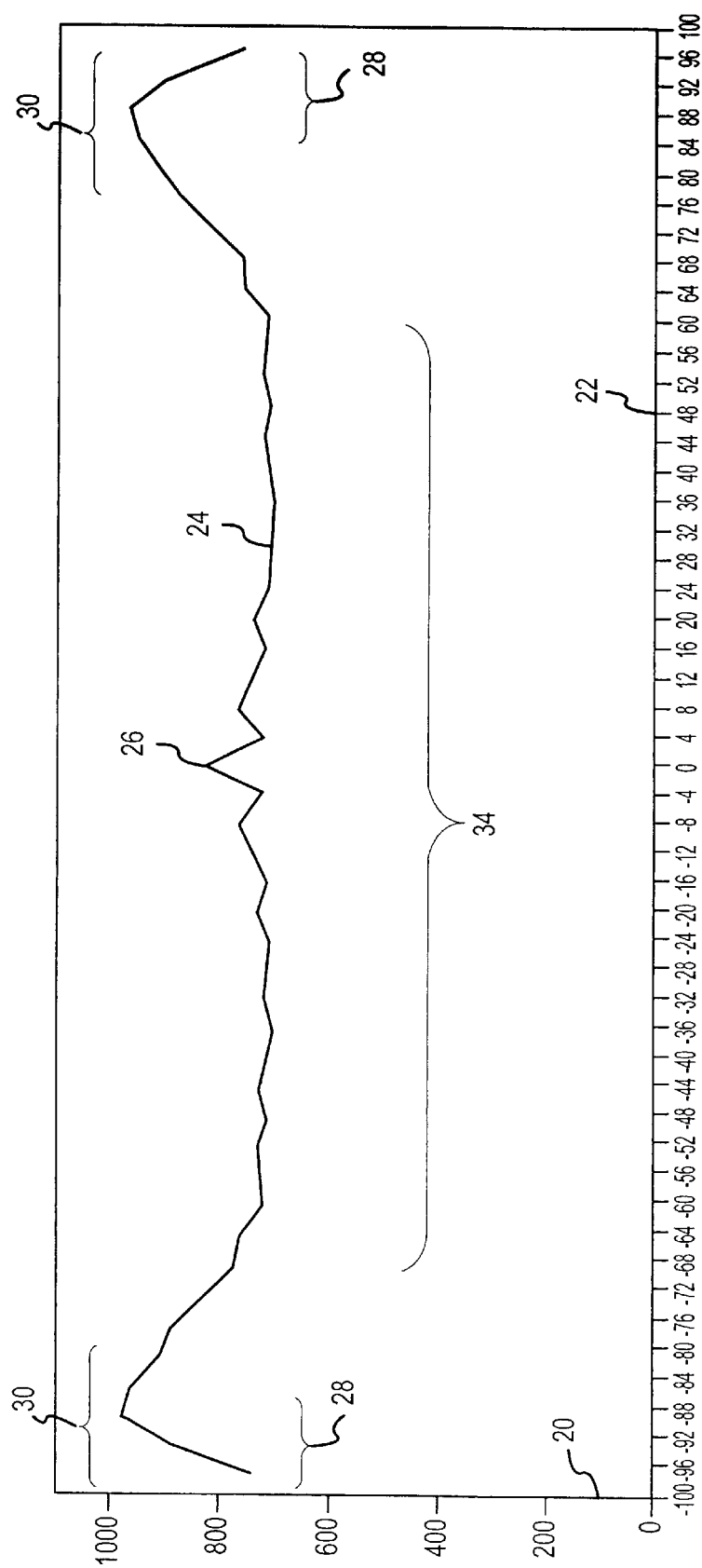
FIG. 1 illustrates graphically a typical experimental work piece diameter scan.

The results of a typical wafer diameter scan are illustrated in FIG. 1 which depicts the results of the measurements graphically. In FIG. 1 the vertical axis 20 indicates the amount of material removed by the CMP process, measured in nanometers (nm). Horizontal axis 22 indicates location along a wafer diameter, measured in millimeters (mm). Line 24 connects a plurality of measured data points, each data point indicating the amount of material removed at a particular location. Line 24 thus indicates material removed as a function of location on the wafer surface. For this particular wafer the nominal amount of material removed is about 800 nm.

Line 24 in FIG. 1 illustrates an experimental wafer diameter scan typical of a CMP operation using a back referenced carrier head and a polishing pad in orbital motion. Several characteristics of the wafer diameter scan can be identified that are typical or representative of this particular CMP process operation. For example, this scan can be considered as the superposition of a high spatial frequency component and a low spatial frequency component. The high spatial frequency component contributes the "jitter" or noise observed along line 24 as well as a center spike 26 at the center of the wafer. The low spatial frequency component itself can be divided into a number of specific components corresponding to specific regions of the wafer surface. For example, as identified on line 24, an edge component 28 exists in the region within about 10 mm of the edge of the wafer. A differential removal rate band 30 exists in a region within about 32 mm from the edge of the wafer. And a center region 34 comprises the remainder of the wafer. Typical, although somewhat different, characteristics could similarly be identified for other CMP processes using other process equipment.

The characteristics of each of the above identified components is determined by certain process mechanisms specific to a particular piece of processing equipment. For example, it is known that the high spatial frequency component is primarily caused by the groove pattern in the polishing pad and can be affected by process parameters such as advanced pad motion, initial pad orientation, offset between the carrier head and the platen upon which the polishing pad rests, and special pad grooving patterns. Likewise, the edge component is affected by the differential pressure between the polish pad platen and the wafer carrier head. The differential removal rate band is affected by the part of the polishing pad that is touched by the wear ring, a component of the carrier head that surrounds the wafer and preconditions the polishing pad as the carrier head and wafer oscillate relative to the polishing pad. The part of the polishing pad touched by the wear ring is known to have a higher material removal rate than does the center (untouched) area of the polishing pad. And the center region is affected by the distribution of the polishing slurry and the polishing pressure across the polishing pad. With prior art evaluation techniques it was difficult to quantify the effect of a change in one of the CMP process variables because of the overlapping effects of the high and low spatial frequency components of the wafer diameter scan as well as the overlapping effects in the edge component and the differential removal rate band. For example, the effect on the center region of a change in polishing pad pressure might be hard to quantify by observation of the wafer diameter scan because of the presence in the scan of the high spatial frequency component.

Figure 2:
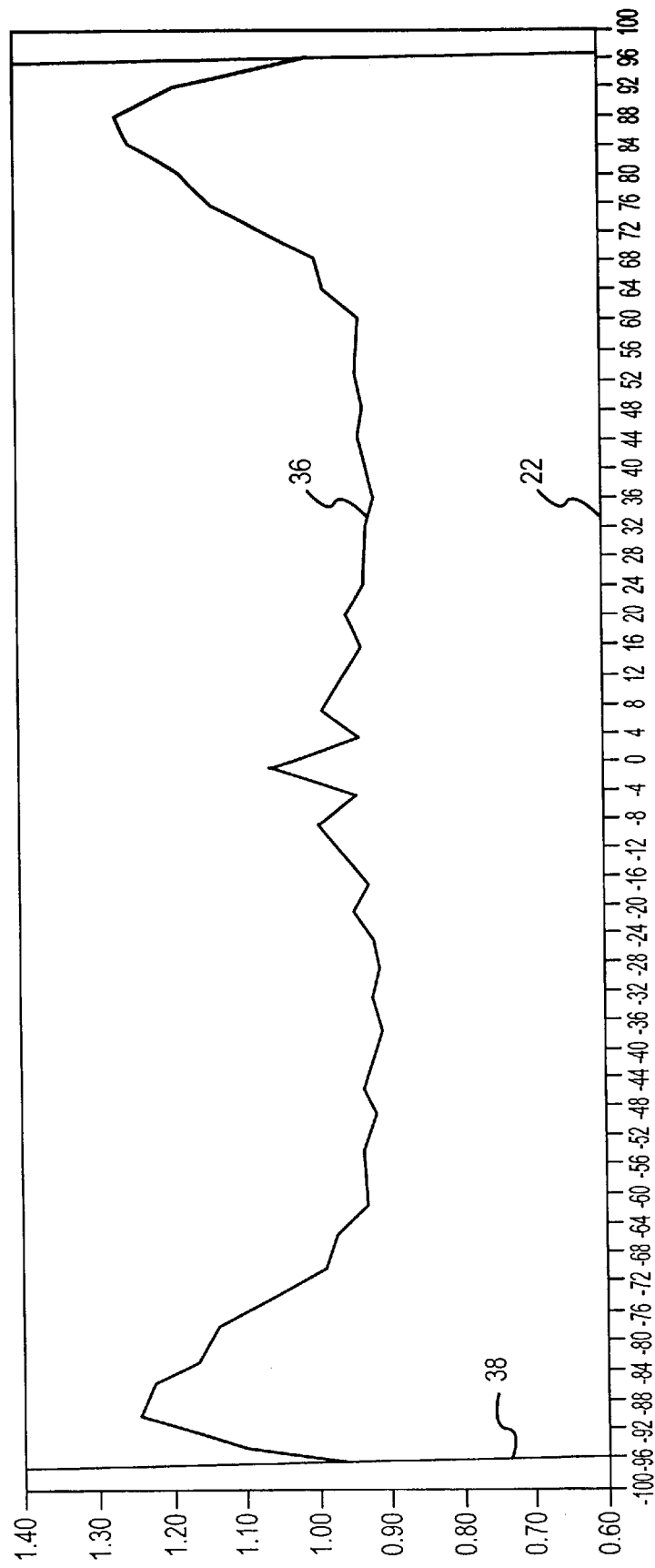
FIG. 2 illustrates graphically a normalized experimental work piece diameter scan.

In accordance with an embodiment of the present invention, the diameter scan components are separated into components that are easily analyzed and quantified. To facilitate this analysis, the raw diameter wafer scan data is preferably normalized and replotted as illustrated in FIG. 2 which illustrates a normalized experimental wafer diameter scan line 36. In FIG. 2 vertical axis 38 represents the normalized material removal with each value divided by the mean value of material removal across the entire diameter scan. Horizontal axis 22 represents position along the wafer diameter measured in millimeters.

To separate the high and low spatial frequency components of the experimental diameter wafer scan, the data in FIG. 2 is fitted to an mth order polynomial. The polynomial expression P(x) determines an approximate expression-for the low spatial frequency component of the experimental diameter wafer scan. The approximation is preferably implemented using a least squares algorithm. According to this algorithm the domain of discrete data points, representing material removed as a function of location on the wafer surface, is approximated by an interpolating polynomial $P_1(x)$ which fits the data:

$$P_1(x)=A_0+A_1x+A_2x^2+\ldots+A_mx^m,$$

where $A_i$ are constant coefficients and m is the order of the polynomial. The least squares approximation finds the polynomial coefficients $A_0, A_1, \ldots, A_m$ by minimizing the function $$Q(F,P)=\Sigma((F(x_i)-P(x_i))^2,$$

where $F(x_i)$ is the domain of data. A "perfect" planarization process will produce an "ideal" diameter scan, namely a straight line for which $F(x_i)=1$. Non-perfect planarization will contribute a number of components to the ideal scan. These components can be separated and analyzed and quantified in accordance with an embodiment of the invention. Once so analyzed and quantified, the effects of process changes on the components can be recognized, and, if desired, the planarization process can be changed to incorporate beneficial process changes.

Figure 3:
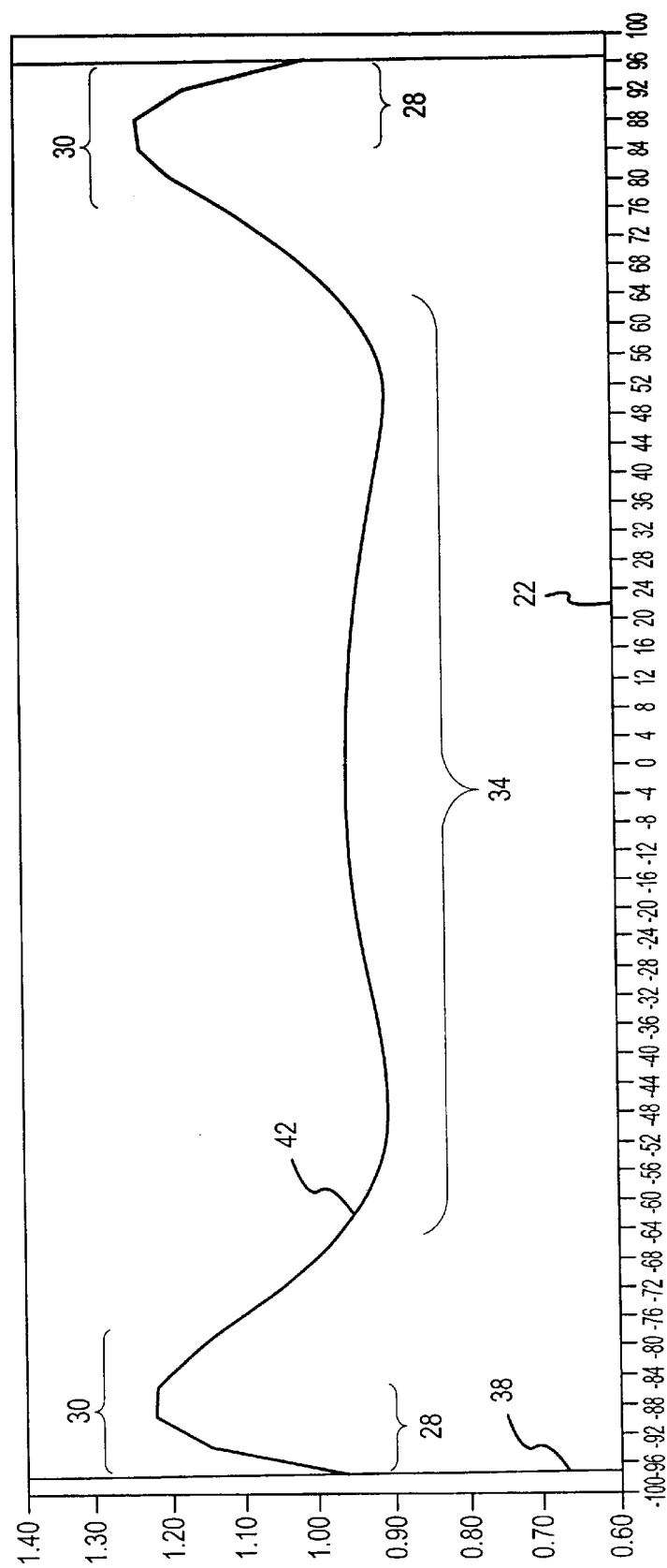
FIG. 3 illustrates graphically an approximation of the low spatial frequency component of an experimental work piece diameter scan.

The order of the interpolating polynomial determines the extent to which the low and high spatial frequency components of the diameter scan are separated and also the extent to which the expression approximates the actual low spatial frequency component. A very high order polynomial does not provide adequate separation of the low and high spatial frequency components; a very low order polynomial does not provide a true approximation of the low spatial frequency component. In a preferred embodiment of the invention, the low spatial frequency component of the experimental wafer diameter scan is approximated by a ninth order polynomial. Using a ninth order polynomial is found to yield an approximation curve that repeats the overall shape of the experimental wafer scan without reacting to the high spatial frequency fluctuations. FIG. 3 illustrates graphically the approximation of the low spatial frequency scan component 42 of the experimental wafer diameter scan that results from fitting the ninth order polynomial to the normalized experimental wafer scan data Again, vertical axis 38 indicates the normalized amount of material removed and horizontal axis 22 indicates location along a wafer diameter, measured in millimeters. Low spatial frequency scan component 42 can again be divided into specific components corresponding to regions of the wafer upon which the polishing characteristics are determined by certain specific process mechanisms. For example, scan component 42 can be divided into an edge component 28, a differential rate removal band 30, and a center region 34.

In accordance with an embodiment of the invention, any or all of the components of scan component 42 can be analyzed and a metric determined for each component; that metric then can be used to quantitatively measure the effect of the process mechanism affecting that component. In accordance with one embodiment of the invention, specific components of scan component 42 are fitted to nth order polynomials where n is an appropriately selected integer less than m.

Observation of center region 34 indicates the region is basically of a symmetrical parabolic shape. Ideally this region (and indeed all the other regions) would be a straight, horizontal, flat line. A metric is need that describes the center region in terms of its "flatness" or deviation from a straight flat line. In accordance with an embodiment of the invention, the center region is approximated by a second order (n=2) polynomial $P_2(x)$ that fits the data:

$$P_2(x)=B_0+B_1x+B_2x^2$$

where the $B_i$ are constant coefficients preferably determined by fitting the data using a least squares approximation. The value of $B_2$, the coefficient of the second order term, indicates the "non-flatness" of the center region. The sign of the second order coefficient indicates whether the center region is convex or concave. The value of $B_2$ provides a metric that can be used to characterize those process mechanisms known to affect the flatness of the center region.

Figure 4:
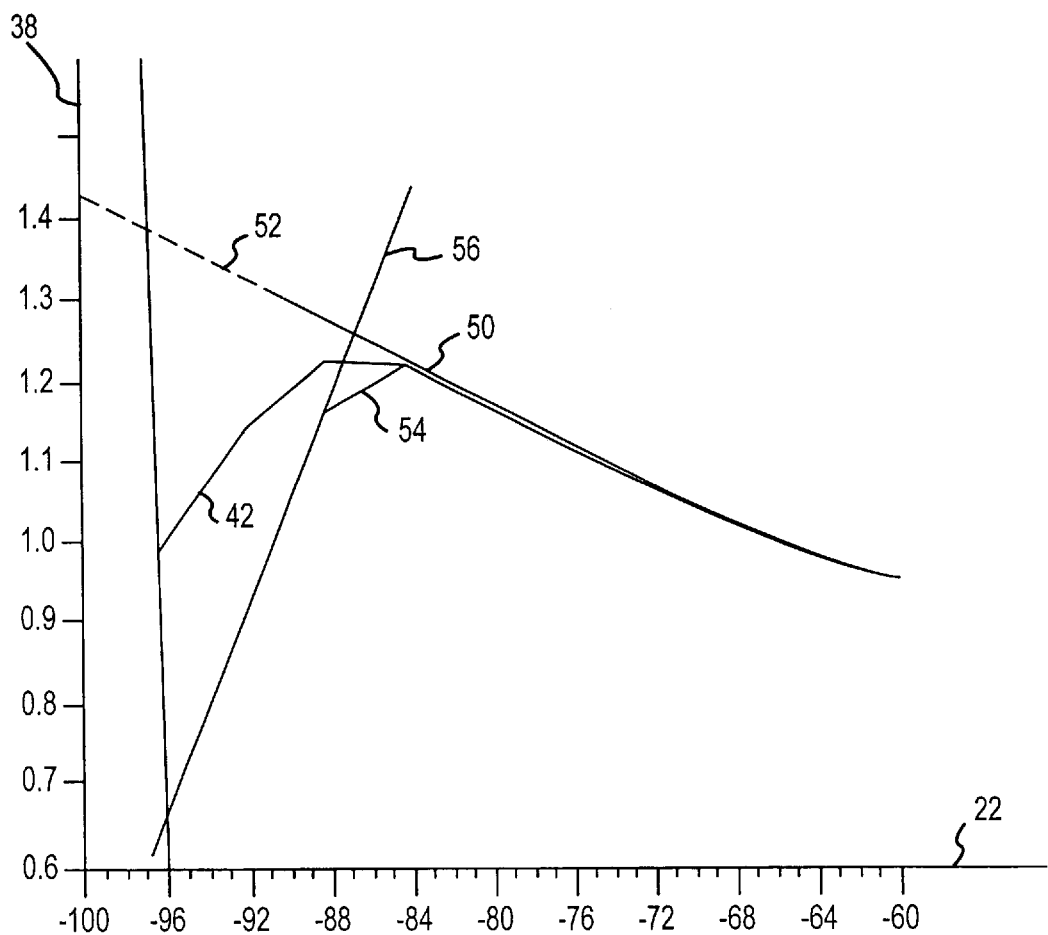
FIG. 4 illustrates graphically a portion of the low spatial frequency component of an experimental work piece diameter scan including polynomial approximations of planarization results at an edge of the work piece.

As noted above, the edge portion of the wafer is divided into two components that are influenced by two sets of process variables. The edge component extends from the edge of the wafer to about 10 mm from the edge; the differential removal rate band extends from the edge of the wafer to about 32 mm from the edge. Because of the overlapping components, influenced by overlapping process variables, it is desirable to separate the two components and to determine a metric for each component. In accordance with one embodiment of the invention the differential removal rate band is approximated by a first order (n=1) polynomial $P_3(x)$ that fits the data in the region extending from the center component to the edge component (from 32 mm to 10 mm in this illustrative embodiment):

$$P_3(x)=C_0+C_1x$$

where the $C_i$ are constant coefficients preferably determined by fitting the data using a least squares approximation. The value of $C_1$, the coefficient of the first order term, indicates the slope of the curve of the differential removal rate band component and can serve as a metric for that component. A low value for $C_1$ indicates the diameter scan is nearly "flat" in the differential removal rate band; a high value indicates large fast band effect. FIG. 4 illustrates graphically the low spatial frequency component line 42 for the left hand side of the wafer. Straight line 50 represents the calculated line $P_3(x)$.

To determine a metric for the edge band component, the straight line $P_3(x)$ is extrapolated to the edge of the wafer, as illustrated by the dashed line 52 in FIG. 4, and the extrapolated values are subtracted from the approximated low frequency component. The subtraction gives values for the edge component unbundled from the differential removal rate component. The values so obtained for the edge component is illustrated by line 54. The edge component so calculated can then be approximated by a first order (n=1) polynomial $P_4(x)$ that fits the data in the region extending from the edge of the wafer to about 10 mm from the edge:

$$P_4(x)=D_0+D_1x$$

where the $D_i$ are constant coefficients preferably determined by fitting the data using a least squares approximation. The calculated straight line $P_4(x)$ is illustrated by line 56. The value of $D_1$, the coefficient of the first order term, indicates the slope of the line approximating the edge band component and can serve as a metric for that component.

Figure 5:
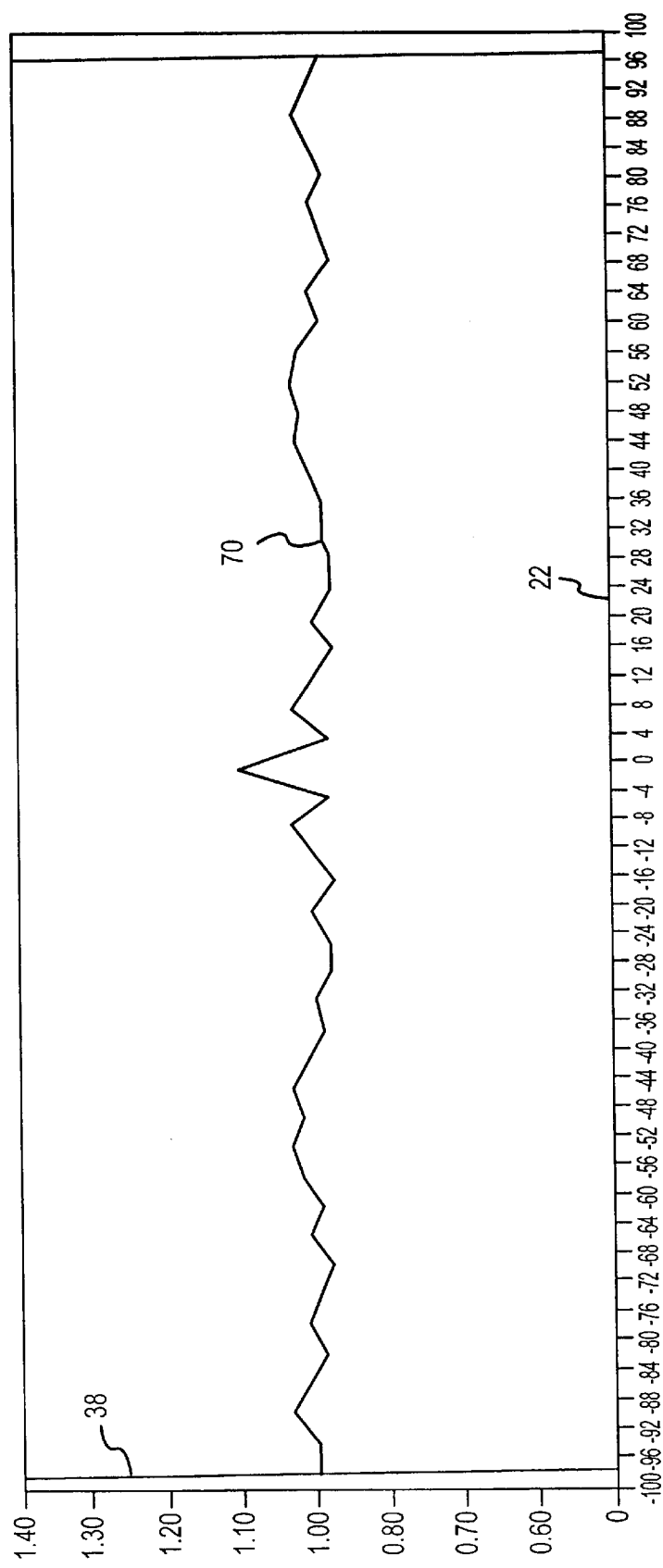
FIG. 5 illustrates graphically an approximation of the high spatial frequency component of an experimental work piece diameter scan.

Having arrived at an expression $P_1(x)$ approximating the low spatial frequency component of the wafer scan, the high spatial frequency component is gotten by subtracting the low spatial frequency component from the experimental wafer scan data. The resultant high spatial frequency component is illustrated in FIG. 5 by the line 70. The vertical axis 38 indicates the normalized amount of material removed and horizontal axis 22 indicates location along a wafer diameter in millimeters. A useful metric for the high spatial frequency component is standard deviation of the component from a straight line. Other metrics for the high spatial frequency component can also be derived. For example, another useful parameter for the high spatial frequency component metric is the range, or the normalized range, of the data as displayed in FIG. 5. This parameter is calculated as the maximum value minus minimum value of material removed.

The above described embodiment illustrates a process for quantifing the results of a planarization process and for determining a metric for various components of the planarization process. In accordance with one embodiment of the invention, the illustrated process can be used in a process for planarizing a work piece, and more specifically can be used to make constructive changes to a planarization process. In accordance with this embodiment of the invention, a surface of a work piece such as a semiconductor wafer is planarized using a process such as a chemical mechanical planarization process. Following the planarization operation, the work piece is cleaned and the amount of material removed by the planarization operation is measured at a plurality of locations on the surface of the work piece to achieve an experimental work piece scan. The experimental work piece scan includes a plurality of experimental data points, each data point indicating the amount of material removed by the planarization operation as a function of location on the work piece surface.

To separate the high and low spatial frequency effects observed in the experimental work piece scan, the experimental data is fitted to an mth order polynomial, preferably using a least squares algorithm, to determine an approximation of a low spatial frequency component of the experimental work piece scan. The work piece surface and the corresponding approximation of the low spatial frequency component are divided into regions, each such region influenced by one or more variables of the planarization operation. A metric is determined for at least one of the regions by fitting the approximated low spatial frequency scan in that region to an nth order polynomial, where n is an integer less than m. The metric for that region is the coefficient of the nth order term in the polynomial. The metric quantifies the divergence of the approximated low spatial frequency component in that region from the ideal result and quantifies the effect of the planarization process variable that affects that region.

Having a metric related to the effect of this process variable allows quantitative analysis of the result of changes to that process variable. The same planarization process operation can then be applied to a second work piece with all process variables the same except for the one selected process variable which is changed in some manner. The second work piece is then analyzed in the same manner and a metric determined for the corresponding region of the second work piece. Comparing the metric determined for the second work piece with the metric determined for the first work piece allows a determination as to whether or not the change in the selected process variable was beneficial to the planarization operation. In accordance with one embodiment of the invention, a feed back mechanism can be built into the process so that changes that are beneficial to the planarization operation are automatically incorporated into the planarization operation for subsequent work pieces.

Thus it is apparent that there has been provided, in accordance with the invention, a process that fully meets the needs set forth above. Although the invention has been described with reference to specific illustrative embodiments, it is not intended that the invention be limited to those illustrative embodiments. Those of skill in the art will recognize that variations and modifications are possible without departing from the spirit of the invention. For example, although the invention has been illustrated with reference to the chemical mechanical planarization of semiconductor wafers, those of skill in the art will appreciate that the invention can be applied to the planarization of many different kinds of work pieces. Indeed, the various embodiments of the invention are not limited to planarization processes, but find application in evaluating many types of processes. Although the inventors have found that a ninth order polynomial expression adequately approximates the low frequency component in their data, a higher or lower order polynomial may prove useful in some other applications. Likewise, in other applications the low frequency component may be divided into more or fewer regions or different regions than those illustrated, and those regions may be better approximated by nth order polynomials other than the first and second order polynomials illustrated. Additionally, although preferred metrics have been discussed for the various components, those of skill in the art will know that other metrics may be used. Accordingly, it is intended to include within the invention all such variations and modifications as fall within the broad scope of the appended claims.

What is claimed is:

1. A process for planarizing a surface of a work piece comprising the steps of:
    (a) subjecting a surface of a first work piece to a planarization process;
    (b) measuring the amount of material removed from the surface during the planarization process at a plurality of locations across the surface to establish an experimental work piece scan comprising a plurality of experimental data points of material removed as a function of location on the surface;
    (c) determining an approximation of a low spatial frequency component of the experimental work piece scan by fitting the plurality of experimental data points to an mth order polynomial;
    (d) dividing the work piece surface into a plurality of regions, each of the plurality of regions influenced by a process variable of the planarization process;
    (e) analyzing the approximation of a low spatial frequency component in at least one of the plurality of regions to determine a metric for the at least one of the plurality of regions;
    (f) changing a process variable corresponding to the at least one of the plurality of regions and subjecting a surface of a second work piece to a planarization process including the changed process variable;
    (g) carrying out steps (b) through (e) on the second work piece; and
    (h) comparing the metric determined for the second work piece to the metric for the first work piece.

2. The process of claim 1 wherein the step of measuring comprises measuring at a plurality of locations along a work piece diameter.

3. The process of claim 1 wherein the step of determining comprises the step of fitting the plurality of experimental data points to a ninth order polynomial.

4. The process of claim 3 wherein the step of determining comprises the step of fitting the plurality of experimental data points to a ninth order polynomial using a least squares algorithm.

5. The process of claim 3 wherein the step of analyzing comprises the step of fitting the low spatial frequency component in at least one of the plurality of regions to a polynomial of order less than nine.

6. The process of claim 5 wherein the step of analyzing comprises the step of fitting the low spatial frequency component in at least one of the plurality of regions to a polynomial of order less than nine using a least squares algorithm.

7. The process of claim 5 wherein the step of analyzing comprises the step of fitting the low spatial frequency component in at least one of the plurality of regions to a second order polynomial.

8. The process of claim 5 wherein the step of analyzing comprises the step of fitting the low spatial frequency component in at least one of the plurality of regions to a first order polynomial.

9. The process of claim 1 further comprising the step of determining an approximation of a high spatial frequency component of the experimental work piece scan by subtracting the approximation of a low spatial frequency component of the experimental work piece scan from the experimental work piece scan.

10. The process of claim 9 further comprising the step of determining a metric for the high spatial frequency component of the experimental work piece scan comprising the step of calculating the standard deviation of the high spatial frequency component of the experimental work piece scan.

11. The process of claim 9 further comprising the step of determining a metric for the high spatial frequency component of the experimental work piece scan comprising the step of calculating the range of the high spatial frequency component of the experimental work piece scan.

12. The process of claim 1 further comprising the step of changing the planarization process in response to the step of comparing the metric.

13. The process of claim 1 wherein the step of subjecting a surface of a first work piece to a planarization process comprises the step of subjecting a surface of a first work piece to a chemical mechanical planarization process.

14. A process for quantifying the results of a planarization process comprising the steps of:
    subjecting a surface of a work piece to a planarization process;
    measuring the amount of material removed from the surface by the planarization process at each of a plurality of locations across the work piece surface to establish a measured work piece scan of experimental data points of material removed as a function of location on the surface;
    fitting the experimental data points to an mth order polynomial, the mth order polynomial representing a low spatial frequency component scan of the measured work piece scan;
    dividing the work piece surface into a plurality of regions, each of the plurality of regions influenced by a process variable in the planarization process;

fitting a portion of the low spatial frequency component scan corresponding to one of the plurality of regions to an nth order polynomial where n is less than m; and characterizing the planarization process in the one of the plurality of regions by the magnitude of the coefficient of the nth order term of the nth order polynomial.

15. The process of claim 14 further comprising the step of subtracting the low spatial frequency component scan from the measured work piece scan to establish an approximation of a high spatial frequency component scan.

16. The process of claim 15 further comprising the step of calculating a metric for the approximation of a high spatial frequency component scan.

17. The process of claim 16 wherein the step of calculating a metric comprises the step of calculating the standard deviation of the high spatial frequency component of the experimental work piece scan.

18. The process of claim 16 wherein the step of calculating a metric comprises the step of calculating the range of the high spatial frequency component of the experimental work piece scan.

19. The process of claim 14 wherein the step of fitting the experimental data points to an mth order polynomial comprise the step of fitting the experimental data points to a ninth order polynomial.

20. The process of claim 19 wherein the step of dividing comprises the step of dividing the work piece surface into a plurality of regions comprising at least a center region.

21. The process of claim 20 wherein the step of fitting a portion of the low spatial frequency component scan comprises the step of fitting the center region to a second order polynomial.

22. The process of claim 19 wherein the step of dividing comprises the step of dividing the work piece surface into a plurality of regions comprising at least an edge component region.

23. The process of claim 22 wherein the step of fitting a portion of the low spatial frequency component scan comprises the step of fitting the edge component region to a first order polynomial.

24. The process of claim 14 wherein the step of subjecting a surface of a work piece to a planarization process comprises the step of subjecting a surface of a work piece to a chemical mechanical planarization process.

25. A process for quantifying the results of a planarization process comprising the steps of:

subjecting a surface of a work piece to a planarization process;

measuring a parameter representative of planarity at a plurality of locations on the surface;

fitting the measured parameters to an mth order polynomial representing a low spatial frequency component scan of the surface;

dividing the work piece surface into a plurality of regions, each of the plurality of surface regions influenced by a process variable in the planarization process;

fitting a portion of the low spatial frequency component scan corresponding to a surface region to an nth order polynomial where n is less than m; and characterizing the planarization process in the surface region by the magnitude of the coefficient of the nth order term of the nth order polynomial.

26. The process of claim 25 wherein the step of fitting the measured parameters to an mth order polynomial comprises the step of fitting the measured parameters to an mth order polynomial using a least squares algorithm.

27. The process of claim 25 wherein the step of fitting a portion of the low spatial frequency component scan comprises the step of fitting a portion of the low spatial frequency component scan using a least squares algorithm.

28. The process of claim 25 wherein the step of subjecting a surface of a work piece to a planarization process comprises the step of subjecting a surface of a work piece to a chemical mechanical planarization process.

29. A process for evaluating a process comprising the steps of:

subjecting a work piece to a process to be evaluated;

measuring a parameter representative of the results of the process at a plurality of locations on the work piece;

fitting the measured parameters to an mth order polynomial to construct a low spatial frequency component scan approximating the low spatial frequency component results on the work piece;

dividing the work piece into a plurality of regions, each of the plurality of regions influenced by a process variable of the process to be evaluated;

fitting a portion of the low spatial frequency component scan corresponding to one of the plurality of regions to an nth order polynomial where n is less than m; and characterizing the process in the one of the plurality of regions by the magnitude of the coefficient of the nth order term of the nth order polynomial.

* * * * *